(12) United States Patent
Hong et al.

(10) Patent No.: US 10,706,927 B1
(45) Date of Patent: Jul. 7, 2020

(54) ELECTRONIC DEVICE AND OPERATING METHOD THEREOF

(71) Applicant: SK hynix Inc., Icheon (KR)

(72) Inventors: Seok-Man Hong, Seoul (KR); Tae-Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/407,100

(22) Filed: May 8, 2019

Related U.S. Application Data

(60) Provisional application No. 62/668,744, filed on May 8, 2018.

(51) Int. Cl.
G11C 13/00 (2006.01)

(52) U.S. Cl.
CPC ........ G11C 13/0069 (2013.01); G11C 13/003 (2013.01); G11C 13/0004 (2013.01); G11C 2013/0078 (2013.01); G11C 2013/0092 (2013.01); G11C 2213/79 (2013.01)

(58) Field of Classification Search
CPC .............................. G11C 16/10; G11C 13/0069
USPC ............................................. 365/163, 185.24
See application file for complete search history.

(56) References Cited

U.S. PATENT DOCUMENTS

| | | | | |
|---|---|---|---|---|
| 4,506,350 A * | 3/1985 | Asano | ..................... | G11C 16/08 365/185.21 |
| 5,005,154 A * | 4/1991 | Masuda | ................. | G11C 17/06 365/230.03 |
| 5,392,240 A * | 2/1995 | Muraoka | ............. | G11C 11/4099 365/189.16 |
| 9,001,582 B2 * | 4/2015 | Fujimura | ............... | G11C 16/06 365/185.06 |
| 9,520,165 B1 * | 12/2016 | Desai | ........................ | G11C 7/12 |
| 2005/0185473 A1 * | 8/2005 | Schubert | ................ | G11C 29/50 365/189.15 |
| 2006/0114737 A1 * | 6/2006 | Terasawa | ........... | G11C 16/0466 365/227 |
| 2006/0118853 A1 * | 6/2006 | Takata | .............. | H01L 29/42332 257/314 |
| 2007/0274124 A1 * | 11/2007 | Otsuka | .................. | G11C 11/417 365/154 |
| 2009/0116280 A1 * | 5/2009 | Parkinson | .......... | G11C 13/0004 365/163 |
| 2010/0046286 A1 * | 2/2010 | Choi | ........................ | G11C 7/12 365/163 |
| 2011/0110162 A1 * | 5/2011 | Wang | ..................... | G11C 7/062 365/185.21 |
| 2011/0228590 A1 * | 9/2011 | Murooka | ........... | G11C 13/0002 365/148 |
| 2011/0320831 A1 * | 12/2011 | Inokuchi | ................... | G06F 1/30 713/300 |

(Continued)

FOREIGN PATENT DOCUMENTS

KR 20110025331 A 3/2011

*Primary Examiner* — Michael T Tran

(57) ABSTRACT

An operating method of an electronic device including a semiconductor memory, the operating method includes selecting one of a plurality of memory cells during a set operation, applying a write current having a slow quenching pattern to the selected memory cell, monitoring a cell current flowing through the selected memory cell, generating a discharge control signal corresponding to a result of the monitoring, and discharging the write current in response to the discharge control signal.

5 Claims, 6 Drawing Sheets

(56) References Cited

U.S. PATENT DOCUMENTS

| | | | | |
|---|---|---|---|---|
| 2012/0327727 A1* | 12/2012 | Wang | ............... | G11C 11/417 |
| | | | | 365/189.16 |
| 2013/0182498 A1* | 7/2013 | Aoki | ............... | G11C 11/1675 |
| | | | | 365/158 |
| 2013/0250670 A1* | 9/2013 | Nakai | ............... | G11C 11/161 |
| | | | | 365/158 |

* cited by examiner

ELECTRONIC DEVICE AND OPERATING METHOD THEREOF

CROSS-REFERENCE TO RELATED APPLICATIONS

The present application claims priority to U.S. Patent Application No. 62/668,744, and filed on May 8, 2018, which is incorporated herein by reference in its entirety.

TECHNICAL FIELD

This patent document relates to memory cell arrays or devices and their applications in electronic devices or systems.

BACKGROUND

Recently, as electronic appliances trend toward miniaturization, low power consumption, high performance, multi-functionality, and so on, semiconductor memories capable of storing information in various electronic appliances such as a computer, a portable communication device, and so on have been demanded in the art, and research has been conducted for the semiconductor devices. Such semiconductor memories include semiconductor memories which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory cell arrays and devices, as well as their applications in electronic devices and systems. The disclosed technology also includes various implementations of an electronic device capable of performing a normal write operation by properly interrupting a write current, and an operating method of the electronic device.

In an implementation, there is provided an electronic device including a semiconductor memory. The semiconductor memory may include: a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal.

The specific resistance state may include a low resistance state. The write current may have a slow quenching pattern. The discharge control circuit may activate the discharge control signal during a time period when the write current has a smaller level than a predetermined interrupted current while the write control signal is activated. The discharge control circuit may include: a current comparing unit suitable for comparing the write current with a predetermined interrupted current; and a monitoring unit suitable for generating the discharge control signal based on a comparison result of the current comparing unit and the write control signal.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, there is provided an electronic device including a semiconductor memory. The semiconductor memory may include: a memory cell array coupled to and disposed between a plurality of first local lines and a plurality of second local lines, and including a plurality of memory cells, each memory cell coupled to a corresponding first local line and a corresponding second local line; a first line selection circuit suitable for coupling one of the first local lines to a first global line based on a plurality of first line selection signals; a write circuit coupled to the first global line, and suitable for applying a write current having a first pattern or a second pattern to the first global line based on a first write control signal or a second write control signal, respectively; a second line selection circuit suitable for coupling one of the second local lines to a second global line based on a plurality of second line selection signals; a discharge control circuit coupled to the second global line, and suitable for monitoring a cell current flowing through a memory cell selected from the memory cells based on the first write control signal and generating a discharge control signal corresponding to a result of the monitoring; and a discharge circuit coupled to the first global line, and suitable for discharging the write current in response to the discharge control signal.

The first pattern may include a slow quenching pattern, and the second pattern may include a fast quenching pattern. The discharge control circuit may activate the discharge control signal when the write current has a smaller level than a predetermined interrupted current while the first write control signal is activated. The discharge control circuit may include: a current comparing unit suitable for comparing the write current with a predetermined interrupted current; and a monitoring unit suitable for generating the discharge control signal based on a comparison result of the current comparing unit and the first write control signal.

In an implementation, there is provided an operating method of an electronic device including a semiconductor memory. The operating method may include: selecting one of a plurality of memory cells during a set operation; applying a write current having a slow quenching pattern to the selected memory cell; monitoring a cell current flowing through the selected memory cell, and generating a discharge control signal corresponding to a result of the monitoring; and discharging the write current in response to the discharge control signal.

The discharging of the write current may be carried out before the set operation is completed. The monitoring of the cell current may include comparing the cell current with an interrupted current, and the generating the discharge control signal may include generating the discharge control signal based on a comparison result. The generating of the discharge control signal may include activating the discharge control signal when the comparison result indicates that the cell current has a smaller level than the interrupted current. The interrupted current may correspond to a set current of the selected memory cell.

DETAILED DESCRIPTION

Figure 1:
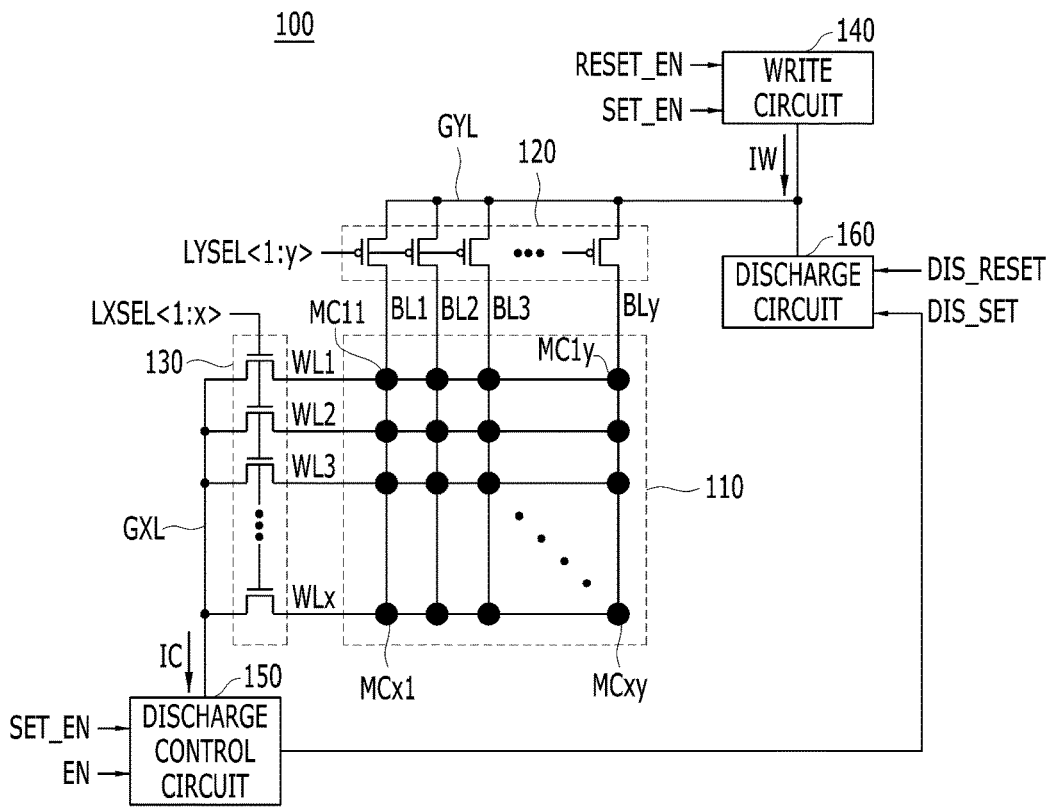
FIG. 1 is a block diagram illustrating a memory device in accordance with an implementation.

Various examples and implementations of the disclosed technology are described below in more detail with reference to the accompanying drawings. These examples and implementations are provided so that this disclosure is thorough and complete, and fully conveys the scope of the present invention to those skilled in the art. Moreover, detailed descriptions related to well-known functions or configurations will be omitted in order to clearly describe the subject matters of the present invention. Throughout the disclosure, like reference numerals refer to like parts throughout the various figures and embodiments of the present invention.

A semiconductor memory device in accordance with implementations of the disclosed technology may include a variable resistance element that exhibits a variable resistance characteristic, i.e., a variable resistance element that represents different digital bits or states by exhibiting different resistance values. In implementations, such a variable resistance element may include a single-layer or a multi-layer structure exhibiting the variable resistance characteristic, and may include any of a material used in a RRAM, PRAM, STTRAM, MRAM or FRAM (e.g., a ferromagnetic material); a ferroelectric material; a phase change material, such as a chalcogenide material; a metal oxide, such as a perovskite material; and a transition metal oxide.

The variable resistance element may include a metal oxide, a perovskite material, or both. The metal oxide may include a transition metal oxide such as a nickel (Ni) oxide, a titanium oxide (TiO), a hafnium oxide (HfO), a zirconium oxide (ZrO), a tungsten oxide (WO), or a cobalt oxide (CoO). The perovskite material may include a material such as a strontium titanium oxide (STO: SrTiO) or a praseodymium calcium manganese oxide (PCMO: PrCaMnO).

Moreover, the variable resistance element may include a phase change material. The phase change material may include a chalcogenide material, such as germanium-antimony-tellurium (GST: GeSbTe). The variable resistance element switches between different resistance states by changing its structure into a crystalline state or an amorphous state according to heat applied to the phase change material.

The variable resistance element may include two magnetic layers and a tunnel barrier layer interposed between the two magnetic layers. The magnetic layer may include any of nickel-iron-cobalt (NiFeCo), Cobalt-iron (CoFe), etc. The tunnel barrier layer may include aluminum oxide (Al$_2$O$_3$). The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

FIG. 1 is a block diagram illustrating a memory device 100 in accordance with an implementation.

Referring to FIG. 1, the memory device 100 may include a memory cell array 110, a bit line selection circuit 120, a word line selection circuit 130, a write circuit 140, a discharge control circuit 150, and a discharge circuit 160.

The memory cell array 110 may have a cross point array structure. The cross point array structure may include a structure where a plurality of memory cells MC11 to MCxy are arranged at respective cross points between a plurality of local bit lines BL1 to BLy and a plurality of local word lines WL1 to WLx, x and y being positive integers. The local bit lines BL1 to BLy may extend in a first direction, and the local word lines WL1 to WLx may extend in a second direction that crosses the first direction. Each of the memory cells MC11 to MCxy may be turned on according to a voltage difference between both ends thereof, and have a resistance state that is varied according to a cell current IC flowing thereto. The memory cells MC11 to MCxy may have the same structure. Although not illustrated, each of the memory cells MC11 to MCxy may include, for example, a variable resistance element and a selection element.

The variable resistance element of the memory cell MC may include a phase-change material. The variable resistance element may have a high resistance state, i.e., an amorphous state, or a low resistance state, i.e., a crystalline state. More specifically, when a write current IW having a fast quenching pattern is applied to the variable resistance element during a reset operation, the variable resistance element may be melted and then rapidly cooled down. Consequently, the variable resistance element may have the high resistance state, i.e., the amorphous state. On the other hand, when the write current IW having a slow quenching pattern is applied to the variable resistance element during a set operation, the variable resistance element may be melted and then slowly cooled down. Consequently, the variable resistance element may have the low resistance state, i.e., the crystalline state.

The selection element of the memory cell MC may include an ovonic threshold switch (OTS) containing a chalcogenide-based material. The selection element may be turned on when the voltage difference between both ends of the memory cell MC, that is, a voltage difference between a local bit line BL # and a local word line WL # is higher than a threshold voltage of the selection element. The memory cell MC is coupled to and disposed between the local bit line BL # and the local word line WL #.

The bit line selection circuit 120 may couple a selected one of the local bit lines BL1 to BLy to a global bit line GYL based on a plurality of local bit line selection signals LYSEL<1:y>.

The word line selection circuit 130 may couple a selected one of the local word lines WL1 to WLx to a global word line GXL based on a plurality of local word line selection signals LXSEL<1:x>.

The write circuit 140 may apply the write current IW having the slow quenching pattern to the global bit line GYL during the set operation in response to a first write control signal SET_EN, and apply the write current IW having the fast quenching pattern to the global bit line GYL during the reset operation in response to a second write control signal RESET_EN.

The discharge control circuit 150 may generate a first discharge control signal DIS_SET based on the first write control signal SET_EN and a write enable signal EN. For example, the discharge control circuit 150 may monitor a level of the cell current IC during the set operation, and generate the first discharge control signal DIS_SET corresponding to a result of the monitoring. The first discharge control signal DIS_SET may be activated before the set operation is completed.

The discharge circuit 160 may forcibly discharge the write current IW applied to the global bit line GYL during the set operation in response to the first discharge control signal DIS_SET, and forcibly discharge a current remaining in the global bit line GYL during the reset operation in response to a second discharge control signal DIS_RESET. Since the second discharge control signal DIS_RESET, which is related to the reset operation, is irrelevant to the present implementation, detailed descriptions thereof are omitted herein.

Figure 2:
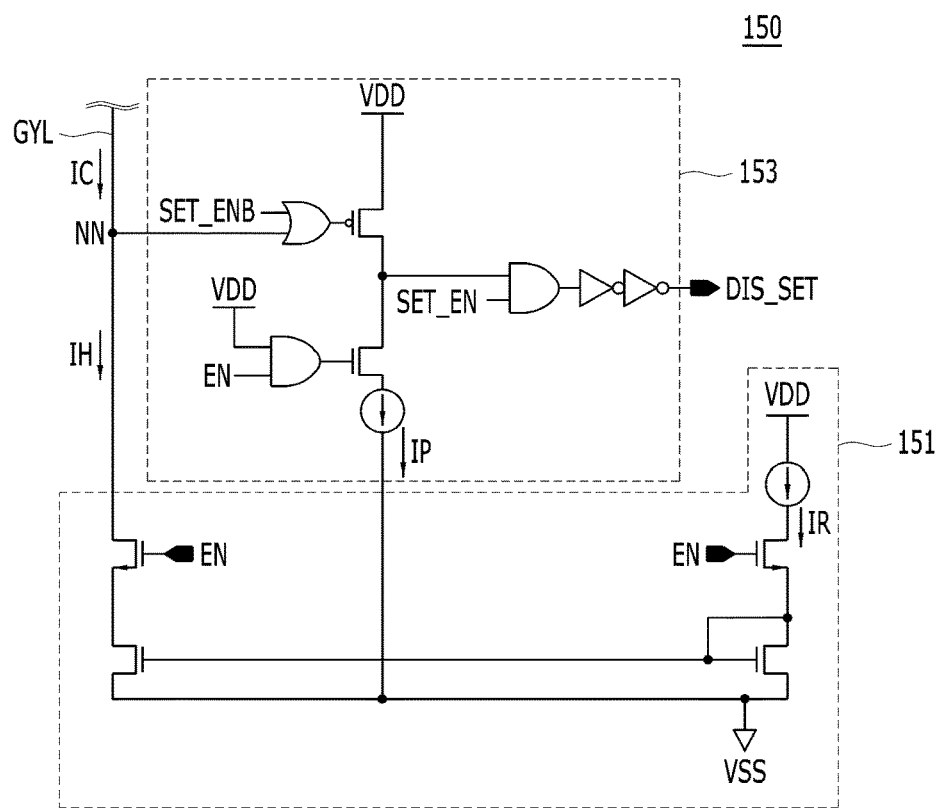
FIG. 2 is a circuit diagram illustrating a discharge control circuit shown in FIG. 1 in accordance with an implementation.

FIG. 2 is a circuit diagram illustrating the discharge control circuit 150 shown in FIG. 1 in accordance with an implementation.

Referring to FIG. 2, the discharge control circuit 150 may include a current comparing unit 151 and a monitoring unit 153.

The current comparing unit 151 may compare the cell current IC with an interrupted current IH. For example, the current comparing unit 151 may be enabled in response to the write enable signal EN, and sink the interrupted current IH from a comparison node NN by mirroring a set current IR.

The monitoring unit 153 may generate the first discharge control signal DIS_SET corresponding to a voltage level of the comparison node NN, when the write enable signal EN and the first write control signal SET_EN are activated. The voltage level of the comparison node NN may be defined by the cell current IC and the interrupted current IH. For example, when the cell current IC is larger than the interrupted current IH, the voltage level of the comparison node NN may correspond to a power supply voltage VDD, which may be applied from the write circuit 140. In this case, the monitoring unit 153 may generate the first discharge control signal DIS_SET which is deactivated according to a pre-charge current IP. On the other hand, when the interrupted current IH is larger than the cell current IC, the voltage level of the comparison node NN may correspond to a ground voltage VSS. In this case, the monitoring unit 153 may generate the first discharge control signal DIS_SET which is activated regardless of the precharge current IP.

Figure 3:
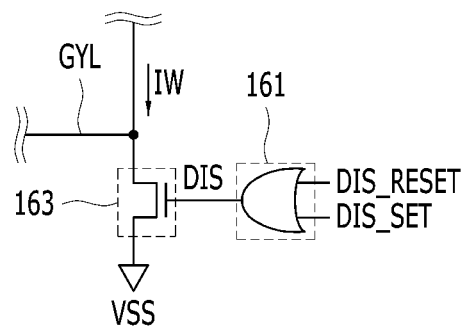
FIG. 3 is a circuit diagram illustrating a discharge circuit shown in FIG. 1 in accordance with an implementation.

FIG. 3 is a circuit diagram illustrating the discharge circuit 160 shown in FIG. 1 in accordance with an implementation.

Referring to FIG. 3, the discharge circuit 160 may include a logic operation unit 161 and a discharge unit 163.

The logic operation unit 161 may generate a discharge enable signal DIS by performing a predetermined logic operation on the first and second discharge control signals DIS_SET and DIS_RESET.

The discharge unit 163 may selectively couple the global bit line GYL to a supply terminal of the ground voltage VSS in response to the discharge enable signal DIS.

Hereinafter, a write operation of the memory device 100 having the aforementioned structure shown in FIGS. 1 to 3 is described with reference to FIG. 4.

Figure 4:
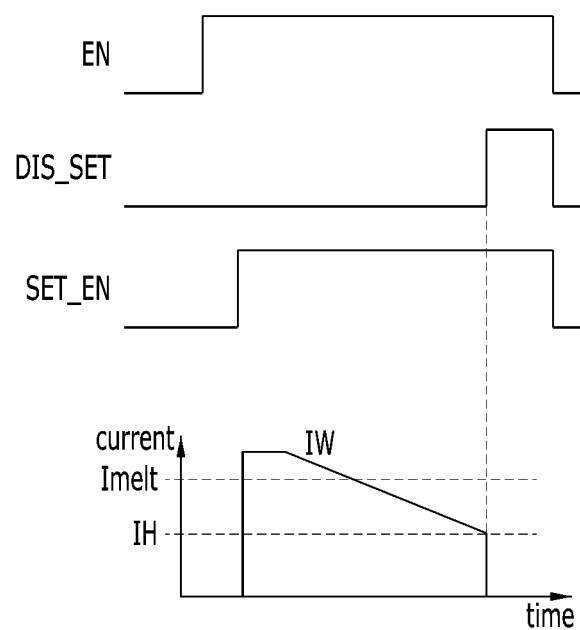
FIG. 4 is a timing diagram for describing an operation of the memory device shown in FIGS. 1 to 3.

FIG. 4 is a timing diagram for describing an operation of the memory device 100 shown in FIGS. 1 to 3. FIG. 4 is the timing diagram for describing the set operation related to a conceptual point of the present invention.

Referring to FIG. 4, the bit line selection circuit 120 may couple one of the local bit lines BL1 to BLy to the global bit line GYL based on the local bit line selection signals LYSEL<1:y>, and the word line selection circuit 130 may couple one of the local word lines WL1 to WLx to the global word line GXL based on the local word line selection signals LXSEL<1:x>. When it is assumed that the bit line coupled to the global bit line GYL among the local bit lines BL1 to BLy is a selected bit line and the word line coupled to the global word line GXL among the local word lines WL1 to WLx is a selected word line, a memory cell coupled to and disposed between the selected word line and the selected bit line may be referred to as a selected memory cell. For example, when the selected bit line is the first bit line BL1 and the selected word line is the first word line WL1, the first memory cell MC11 coupled to and disposed between the first bit line BL1 and the first word line WL1 may be the selected memory cell. Both ends of the selected memory cell MC11 may be coupled to the write circuit 140 and the discharge control circuit 150 through the bit line selection circuit 120 and the word line selection circuit 130, respectively.

Under these circumstances, when the write enable signal EN is activated, the current comparing unit 151 may sink the interrupted current IH from the comparison node NN. For example, the current comparing unit 151 may generate the interrupted current IH by mirroring the set current IR. It is preferable that the interrupted current IH is set to a smaller value than an initial value of the write current IW having the slow quenching pattern. For example, the interrupted current IH may correspond to a hold current of a selection element included in the selected memory cell. The hold current may make the selection element maintain a turn-on state after being turned on. In other words, when a current larger than the hold current flows through the selected memory cell and thus a voltage difference between both ends of the selected memory cell is equal to or higher than a hold voltage, the selection element of the selected memory cell may maintain the turn-on state.

As the write enable signal EN is activated, the monitoring unit 153 may generate the first discharge control signal DIS_SET that is deactivated according to the precharge current IP.

Subsequently, the write circuit 140 may generate the write current IW having the slow quenching pattern in response to the first write control signal SET_EN that is activated. For example, the write current IW having the slow quenching pattern may have an initial level equal to or higher than a level Imelt capable of melting a variable resistance element included in the selected memory cell, and the level of the write current IW linearly decreases from the initial level as time elapses.

The variable resistance element may be changed to the low resistance state by the write current IW having the slow quenching pattern.

When the cell current IC corresponding to the write current IW becomes smaller than the interrupted current IH, the monitoring unit 153 may activate the first discharge control signal DIS_SET regardless of the precharge current IP. In other words, the first discharge control signal DIS_SET may be activated while the cell current IC is smaller than the interrupted current IH, when the write enable signal EN and the first write control signal SET_EN are activated. Accordingly, the discharge circuit 160 may discharge the write current IW having the slow quenching pattern, which is applied to the global bit line GYL, in response to the activated first discharge control signal DIS_SET that is activated. In other words, the discharge circuit 160 may be enabled before the set operation is completed, and then forcibly discharge the write current IW having the slow quenching pattern.

As is apparent from the above descriptions, the memory device in accordance with the implementation may interrupt the write current IW by forcibly discharging the write current IW to thereby prevent a phenomenon in which the selection element of the selected memory cell is in an oscillation state when the write current IW is at a level equal to or lower than the interrupted current IH, that is, in which the selection element is repeatedly turned on and off.

According to the implementations described above, the reliability of the write operation of the memory device can be improved by properly interrupting the write current IW that is applied to a selected memory cell before the write current IW reaches the interrupted current IH.

The above and other memory circuits or semiconductor devices based on the disclosed technology may be used in a range of devices or systems. FIGS. 5-9 provide some examples of devices or systems that may implement the memory circuits disclosed herein.

Figure 5:
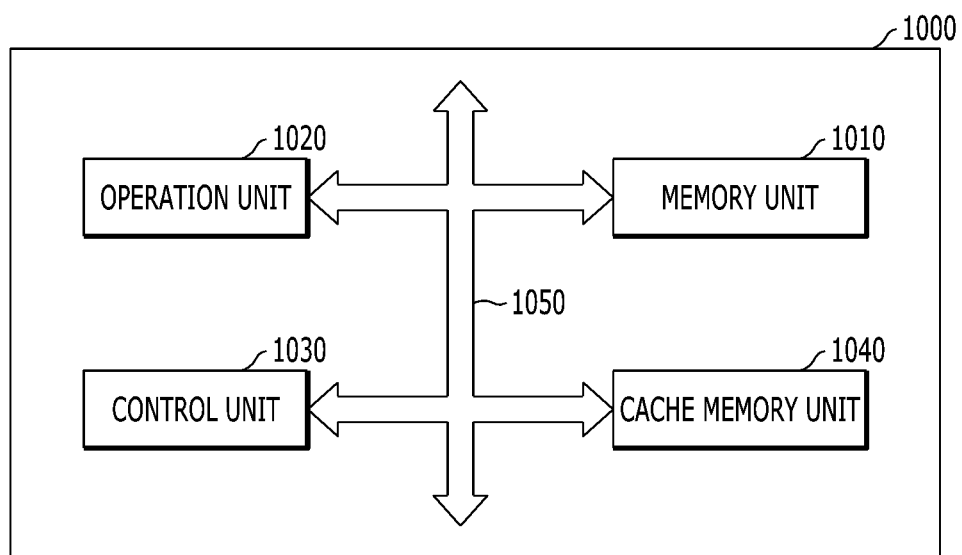
FIG. 5 is an example of a configuration diagram of a microprocessor implementing memory circuitry based on an implementation of the disclosed technology.

FIG. 5 is an example of a configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
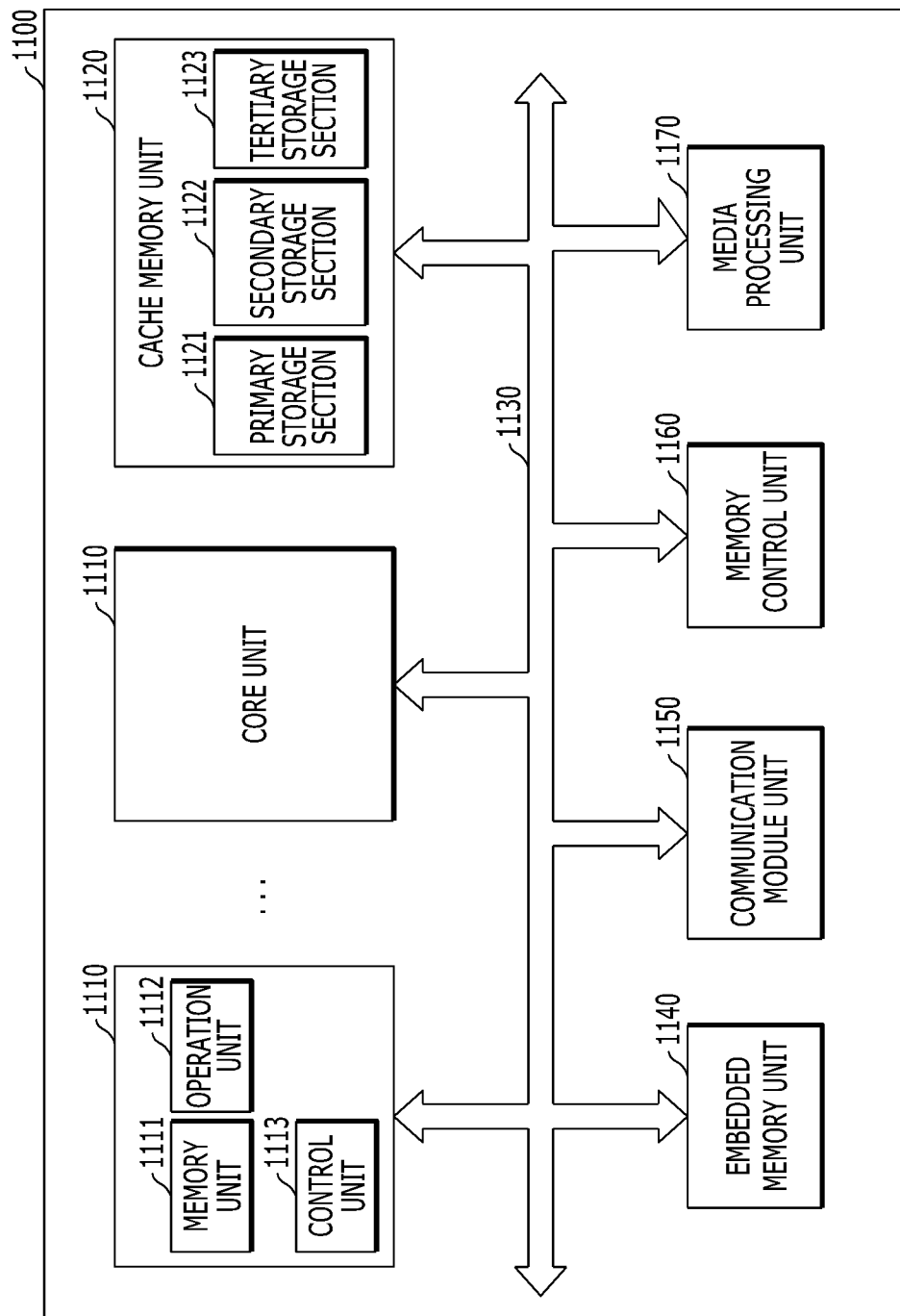
FIG. 6 is an example of a configuration diagram of a processor implementing memory circuitry based on an implementation of the disclosed technology.

FIG. 6 is an example of a configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the cache memory unit 1120 may be improved. As a consequence, performance characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
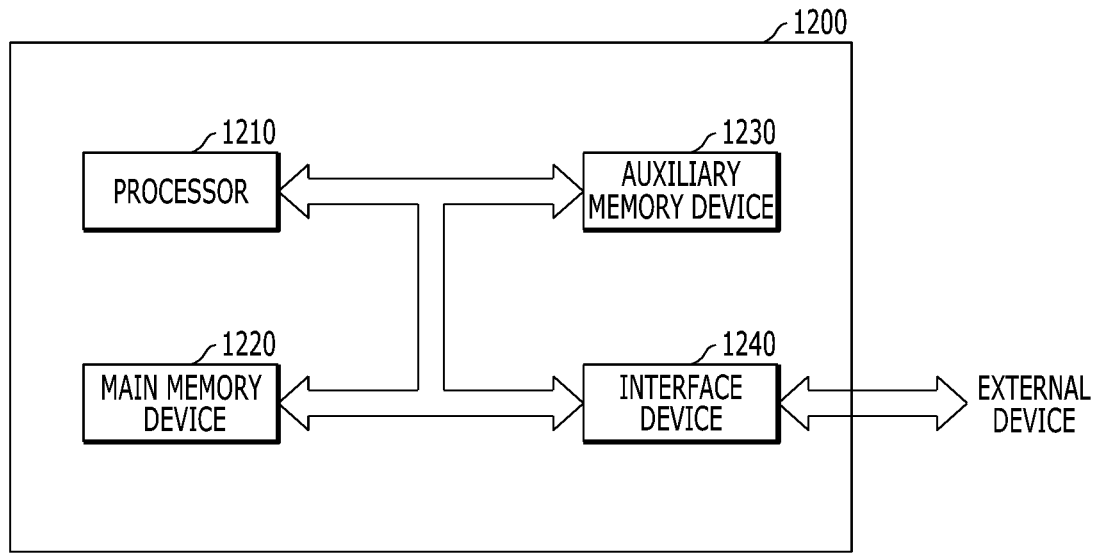
FIG. 7 is an example of a configuration diagram of a system implementing memory circuitry based on an implementation of the disclosed technology.

FIG. 7 is an example of a configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
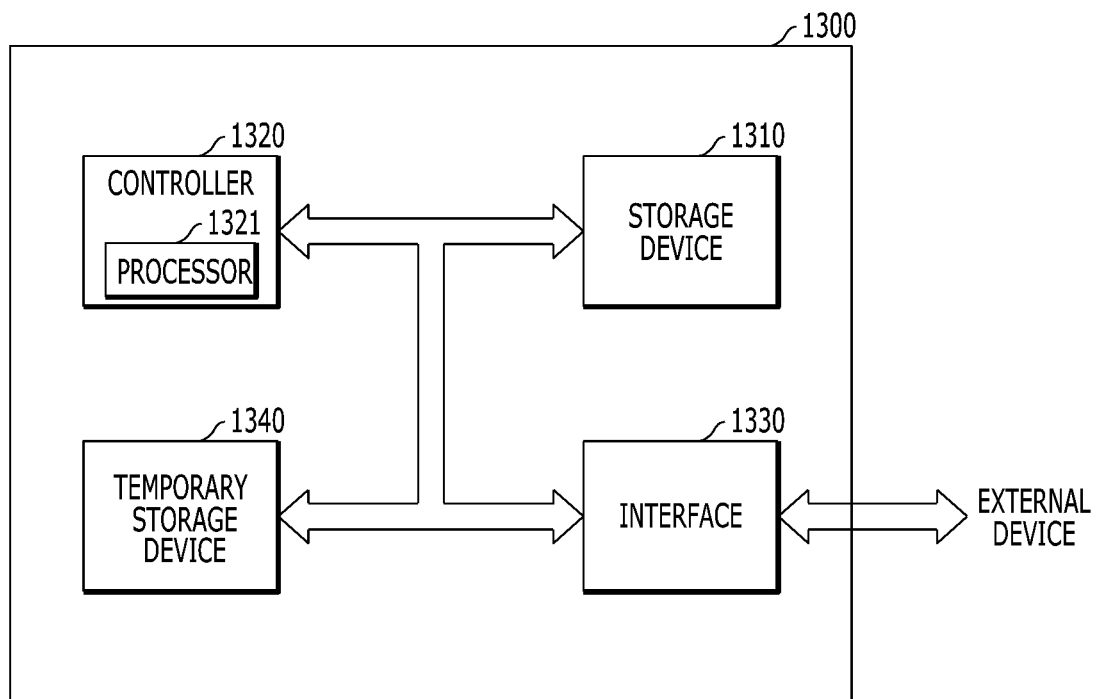
FIG. 8 is an example of a configuration diagram of a data storage system implementing memory circuitry based on an implementation of the disclosed technology.

FIG. 8 is an example of a configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the temporary storage device 1340 may be improved. As a consequence, performance characteristics of the system 1300 may be improved.

Figure 9:
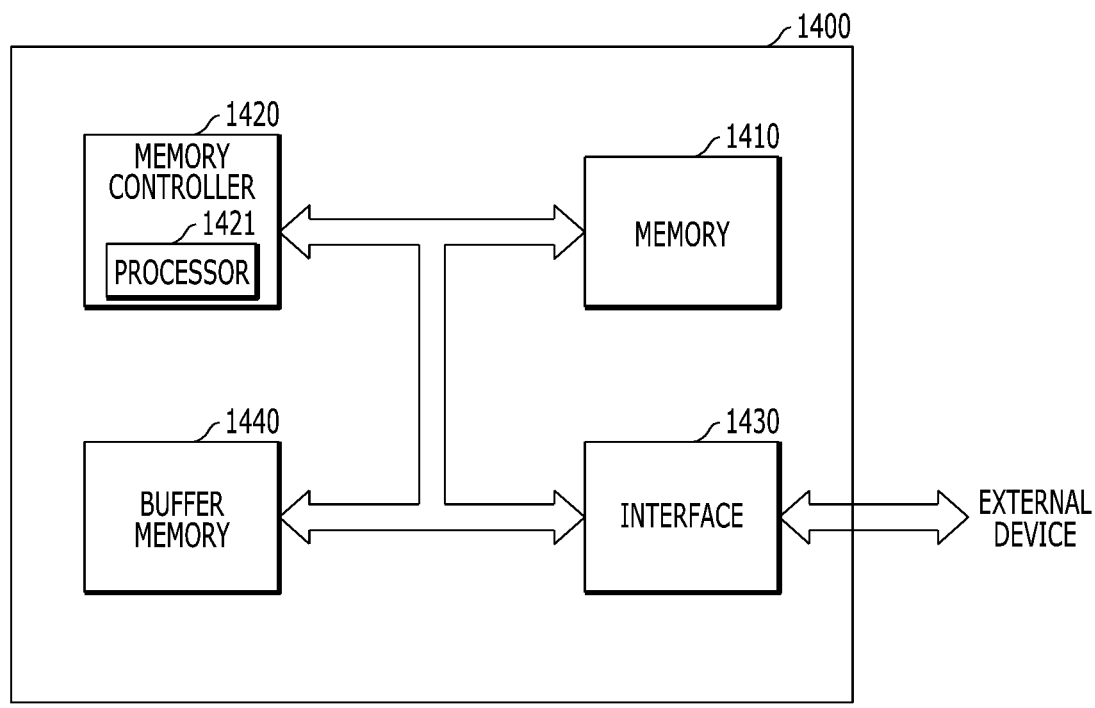
FIG. 9 is an example of a configuration diagram of a memory system implementing memory circuitry based on an implementation of the disclosed technology.

FIG. 9 is an example of a configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the memory 1410 may be improved. As a consequence, performance characteristics of the memory system 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory cell coupled to and disposed between a first line and a second line, a storage state of the memory cell being determined based on a write current; a write circuit suitable for applying the write current corresponding to a specific resistance state to the memory cell in response to a write control signal in a write operation; a discharge control circuit suitable for monitoring a cell current flowing through the memory cell, based on the write control signal, and generating a discharge control signal corresponding to a result of the monitoring, in the write operation; and a discharge circuit suitable for discharging the write current in response to the discharge control signal. Through this, characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, initializing a resistance variable element is easy, and it is possible to secure reliable characteristics of the resistance variable element.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An operating method of an electronic device including a semiconductor memory, the operating method comprising:
    selecting one of a plurality of memory cells during a set operation;
    applying a write current having a slow quenching pattern to the selected memory cell;
    monitoring a cell current flowing through the selected memory cell, and generating a discharge control signal corresponding to a result of the monitoring; and
    discharging the write current in response to the discharge control signal.

2. The operating method according to claim 1, wherein the discharging of the write current is carried out before the set operation is completed.

3. The operating method according to claim 1, wherein the monitoring of the cell current includes comparing the cell current with an interrupted current, and
    wherein generating the discharge control signal includes generating the discharge control signal based on a comparison result.

4. The operating method according to claim 1, wherein the generating of the discharge control signal includes activating the discharge control signal when the comparison result indicates that the cell current has a smaller level than the interrupted current.

5. The operating method according to claim 1, wherein the interrupted current corresponds to a set current of the selected memory cell.

* * * * *